United States Patent [19]
Liao

[11] Patent Number: 5,324,974
[45] Date of Patent: Jun. 28, 1994

[54] NITRIDE CAPPED MOSFET FOR INTEGRATED CIRCUITS

[75] Inventor: I-Chi Liao, Tao-Yuan Hsien, Taiwan

[73] Assignee: Industrial Technology Research Institute, Hsinchu, Taiwan

[21] Appl. No.: 46,781

[22] Filed: Apr. 14, 1993

Related U.S. Application Data

[62] Division of Ser. No. 576,958, Sep. 4, 1990, Pat. No. 5,234,850.

[51] Int. Cl.$^5$ ................... H01L 29/68; H01L 29/78
[52] U.S. Cl. ........................ 257/344; 257/640; 257/408; 257/900; 257/649; 257/413
[58] Field of Search .............. 257/412, 413, 408, 900, 257/639, 640, 344

[56] References Cited

U.S. PATENT DOCUMENTS

| | | | |
|---|---|---|---|
| 4,690,730 | 9/1987 | Tang et al. | 156/643 |
| 4,935,380 | 6/1990 | Okumura | 257/408 |
| 5,030,585 | 7/1991 | Gonzalez et al. | 257/408 |

FOREIGN PATENT DOCUMENTS

| | | | |
|---|---|---|---|
| 195607A | 9/1986 | European Pat. Off. | 257/408 |
| 59-159544 | 9/1984 | Japan | 257/412 |
| 61-81664 | 4/1986 | Japan | 257/412 |
| 6358971 | 3/1988 | Japan | 257/344 |

Primary Examiner—Sara W. Crane
Assistant Examiner—John F. Guay
Attorney, Agent, or Firm—George D. Saile

[57] ABSTRACT

A method is described for fabricating a lightly doped drain MOSFET integrated circuit device. The method begins by forming a pattern of gate electrode structures upon a semiconductor substrate which structures each includes a gate oxide, a polysilicon layer and a refractory metal silicide. A thin silicon nitride layer is formed over each of the structures and the exposed surfaces therebetween of the substrate. A pattern of lightly doped regions in the substrate is formed by ion implantation using the polycide gate structures as the mask. A dielectric spacer structure is formed upon the sidewalls of each of the polycide gate structures and over the adjacent portions of the substrate. A pattern of heavily doped regions in the substrate is formed by ion implantation using the polycide structures with spacer structures as the mask to produce the lightly doped drain source/drain structures of an MOSFET device. The integrated circuit device is completed by forming a passivation layer over the structures described and appropriate electrical connecting structures thereover to electrically connect the gate electrode structures and source/drain elements.

5 Claims, 3 Drawing Sheets

NITRIDE CAPPED MOSFET FOR INTEGRATED CIRCUITS

This is a request for filing a divisional application under 37 CFR 1.60, of pending prior application Ser. No. 07/576,958 filed on Sep. 4, 1990 Pat. No. 5,234,850.

BACKGROUND OF THE INVENTION

1. Field of the Invention

The present invention relates to methods for producing integrated circuit devices having lightly doped drain MOSFET with polycide gates structures.

2. Description of Prior Art

The use of polycide gates or interconnect line, that is a combination of layers of polysilicon and a refractory metal silicide is becoming very important as the industry moves to smaller device geometries. In the past, polysilicon was satisfactory as the gate electrodes and for interconnecting lines. However, as these geometries become smaller, polysilicon has become too high in resistivity for these applications due to its affect on RC time delays and IR voltage drops. The use of a combination of refractory metal silicides with polysilicon has proven suitable because of its lower resistivity.

Silicides of certain refractory metals, i.e. tungsten, molybdenum, titanium, and tantalum have been proven to be suitable for use as a low resistance interconnect material for VLSI integrated circuit fabrication. The disilicides pair very well with heavily doped polysilicon to form polycide gates, because of the criteria of low resistivity and high temperature stability. Tungsten silicide has particularly been found to be capable of overcoming some shortcomings, such as stoichiometry control, surface roughness, adhesion, oxidation and reproducibility to be very useful in combination with polysilicon.

The preferred deposition technique of tungsten silicide is low pressure chemical vapor deposition. The oxidation characteristics of tungsten silicide as produced by this method are very similar to those of polysilicon. The silicon to tungsten ratio in the tungsten silicide film can vary according to the tungsten fluoride and silane gas mixture and reactor conditions. It has been found that low pressure chemical vapor deposited tungsten silicide is stable as soon as the silicon to tungsten ratio is moderately greater than two. Higher silicon concentration is necessary to provide excess silicon during high temperature oxidation, maintain tungsten silicide stoichiometry, and improve silicide adhesion to polysilicon.

It is also a fact that peeling of this polycide film can happen frequently if care is not taken during processing and handling of the wafers. This in turn causes the low yield of the product. Workers in the field have tried to overcome this problem by capping with silicon dioxide during the reaction of titanium with the underlying polysilicon layer such as shown by T. E. Tang et al in U.S. Pat. No. 4,690,730.

It is an important object of this invention to overcome this peeling problem and raise yields.

Another object of this invention is to reduce or minimize segregation of boron atoms in the manufacture of lightly doped drain P channel MOSFET integrated circuits.

FIG. 1 illustrates a Prior Art problem called Graded Gate Oxide or GGO. When a lightly doped drain MOSFET structure is formed on and in P- substrate 1 with its elements gate oxide 2, polysilicon gate 3, dielectric spacers 4, lightly doped regions 5 and heavily doped regions 6 it is then necessary to form a passivation layer 7 thereover. A preferred passivation layer is a borophosphosilicate glass. It is preferred because it can be heated to cause the flow and densification of this glass to smooth the surface of the top surface of the structure. The best conditions for heating the glass is in wet oxygen, but this causes the illustrated undesirable GGO turn up of the edges of the polysilicon gate 3 in the FIG. 1.

It is therefor another object of this invention to overcome the Graded Gate Oxide (GGO) problem.

SUMMARY OF THE INVENTION

In accordance with the present invention, a method is described for fabricating a lightly doped drain MOSFET integrated circuit device which overcomes the problems described above in prior integrated circuit devices. The method begins by forming a pattern of gate electrode structures upon a semiconductor substrate which structures each includes a gate oxide, a polysilicon layer and a refractory metal silicide. A thin silicon nitride layer is formed over each of the structures and the exposed surfaces therebetween of the substrate. A pattern of lightly doped regions in the substrate is formed by ion implantation using the polycide gate structures as the mask. A dielectric spacer structure is formed upon the sidewalls of each of the polycide gate structures and over the adjacent portions of the substrate. A pattern of heavily doped regions in the substrate is formed by ion implantation using the polycide structures with spacer structures as the mask to produce the lightly doped drain source/drain structures of an MOSFET device. The integrated circuit device is completed by forming a passivation layer over the structures described and appropriate electrical connecting structures thereover to electrically connect the gate electrode structures and source/drain elements.

Also in accordance with the present invention, there is the resulting integrated circuit device structure from the method described above. This lightly doped drain MOS FET integrated circuit device includes a pattern of gate electrode structures upon a semiconductor substrate which structures each includes a gate oxide, a polysilicon layer and a refractory metal silicide. A thin silicon nitride layer is located over each of the structures and the surface of the substrate. A pattern of lightly doped regions is located in the substrate adjacent to the structures. A dielectric spacer structure is located upon the sidewalls of each of the polycide structures and over the adjacent portions of the substrate. A pattern of heavily doped regions is located in the substrate adjacent to the spacer structure on the sidewalls of the polycide structures and this heavily doped pattern overlaps in part the lightly doped pattern. This pattern forms the lightly doped drain source/drain structures of an MOS FET device. Appropriate electrical connecting structures thereover to electrically connect the gate electrode structure and source/drain elements.

The incorporation of the thin silicon nitride layer in the method and resulting structure as has been done in this invention provides the following advantages. First, the boron implant of the lightly doped drain P− and P+ is prevented from segregating out to the silicon dioxide layer thus minimizing the parasitic source/drain resistance of the P channel MOS FET. Second, the silicon nitride layer being located over the refractory metal silicide will prevent oxidation of this polycide and thereby minimizing the polycide peeling problem. Third, the silicon nitride layer blocks the hydrogen atoms from passing into the device thus improving reliability. Fourth, the silicon nitride layer blocks the movement of oxygen and hydrogen during the densification and flow of the passivation layer to prevent consumption of silicon and to maintain junction integrity. Fifth, due to the presence of the silicon nitride layer the polysilicon layer and the silicon substrate will not be oxidized during the flow of the passivation layer in the preferred wet oxygen ambient, thus preventing the graded gate oxide (GGO) or polysilicon bird's beak which may degrade the device's performance. Sixth, the silicon nitride layer serves as an etching stop when forming the spacer and it protects the source/drain and field oxide regions from being overetched. Seventh, the silicon nitride serves as a pre-implant buffer layer, thus there is no need for a pre-implant oxidation before the source/drain implantations.

DESCRIPTION OF THE PREFERRED EMBODIMENTS

Figure 1:
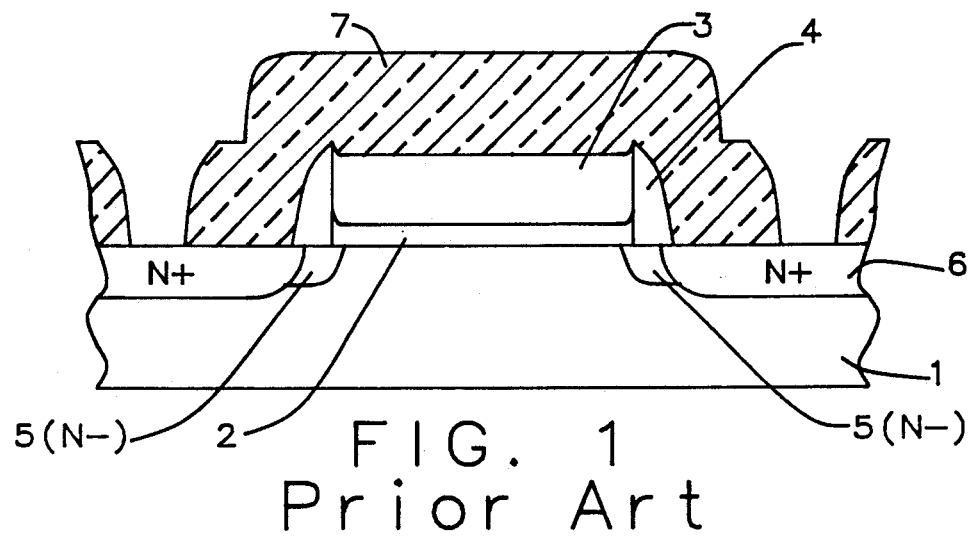
FIG. 1 schematically illustrates the Prior Art graded gate oxide (GGO) problem.

Referring now more particularly to FIGS. 2 through 5, there is shown a first embodiment method for making the lightly doped drain device of the present invention. The first series of steps involve the formation of the dielectric isolation regions for isolating semiconductor surface regions from other such regions in the semiconductor substrate 11. The semiconductor substrate is preferably composed of silicon having a (100) crystallographic orientation. In an effort to simplify the description and the drawings the dielectric isolation between devices have not been shown and will not be described, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide. Then semiconductor devices can be provided in the silicon mesas according to the following processes.

The surface of the silicon substrate 11 is thermally oxidized to form the desired gate oxide 12 thickness. The preferred thickness is between about 100 to 200 Angstroms. The polysilicon layer 14 is blanket deposited by LPCVD (Low Pressure Chemical Vapor Deposition) method. The preferred thickness of the polysilicon layer 14 is between about 0.1 to 0.3 micrometers. The polysilicon layer 14 is ion implanted with phosphorous ions under the conditions $5^{15}$ dosage per area and 50 Kev. or doped with $POCl_3$ at a temperature about 900° C. The resulting surface is cleaned under the following conditions 10:1 HF solution for about 2 minutes. A refractory metal silicide is deposited using low pressure chemical vapor deposition or physical sputtering. The preferred metal silicide is tungsten silicide and the preferred deposition conditions are 200 mTorr., 360° C., silane flow rate of 1800 sccm. and tungsten hexafluoride flow rate of 12 sccm. The thickness of the metal silicide layer 15 is between about 0.1 to 0.3 micrometers and the preferred thickness is 0.2 micrometers. Lithography and etching is now used to form a lithographic mask over the polycide layered structure. The mask pattern protects the designated area to be the polycide gate structures. The masked structure is now patterned by any conventional etching process using, for example a LAM 490 machine to define the desired vertical profile.

The silicon dioxide layer 13 is now grown upon the polycide structure 14, 15 and the planned source/drain regions of the silicon substrate. The subjection of the refractory metal silicide to any oxidation can cause a peeling of this layer. It is therefore critical that this oxidation be performed by rapid thermal anneal and rapid thermal oxidation under the following conditions of 950° C. for about 20 seconds in an ambient of nitrogen and oxygen, sequentially. The rapid thermal anneal is used to anneal the damage formed during gate dry etching and slightly anneal the silicide layer at the same time. The rapid thermal oxidation prevents the exposure of the silicide layer 15 to oxygen for an unnecessarily long time. The thickness of this silicon dioxide layer 13 is also critical and should be between 50 and 100 Angstroms and preferably about 50 Angstroms. It is very preferable to have a pad layer of at least 50 Angstroms under the subsequently applied silicon nitride layer 16 to minimize stress. However, a thickness greater than about 100 Angstroms is a problem because in the following implantation steps, the LDD N−, N+, LDD P−, P+ impurity species are to be implanted through this silicon nitride/silicon dioxide composite layer. If the thickness of this silicon nitride/silicon dioxide composite layer is too thick, most of the implanted dosage may be trapped in the composite layer and could cause process and device problems.

The very critical silicon nitride layer 16 is now deposited over the silicon dioxide layer 13. The preferred deposition process is by low pressure chemical vapor deposition method using silane, oxygen and nitride producing gas (such as ammonia) gases at temperature of 760° C. The critical thickness is between about 80 to 300 Angstroms. It is necessary to have at least a thickness of more than about 80 Angstroms to block out the movement of hydrogen and oxygen atoms from reaching the silicon substrate 11 and polycide layer 14, 15, and less than about 300 Angstroms so that the subsequent ion implantations for N+ and P+ can pass through this silicon nitride layer.

It is possible that the lightly doped drain N− and P− ion implantations are made before depositing the silicon nitride layer 16, but it is not preferred. Should this alternative be followed, the energy of the ion implants would of course be different.

Figure 2:
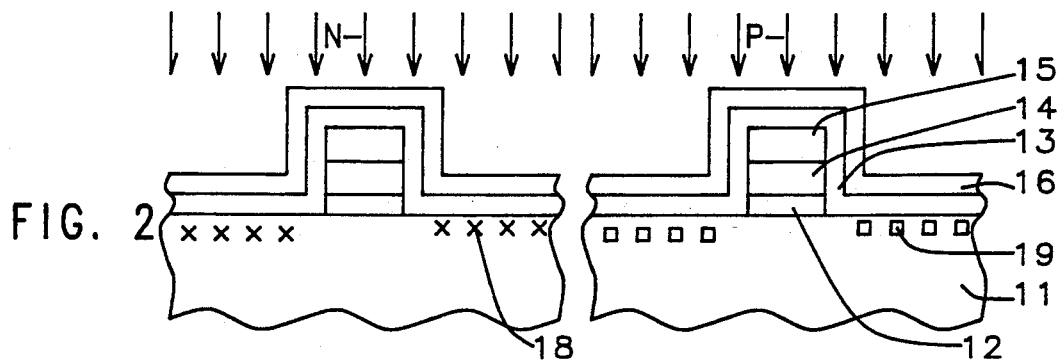
FIG. 2 through FIG. 5 schematically illustrates the first embodiment method for making a lightly doped drain MOS FET integrated circuit of the invention.

The source/drain structure of the MOS FET may now formed by the following steps. The FIGS. 2 through 5 illustrate the formation of a CMOS FET integrated circuit device. FIG. 2, for example shows the ion implantations of N− and P− dopants. However, it will be understood by those skilled in the art that these implantations must be done at different times and with appropriate lithographic masks protecting the area not to be subjected to that particular ion implantation. The formation of the lithographic masks are done by conventional lithography and etching techniques. The N− lightly doped drain implantation 18 is done with phosphorous P31 at a dose of $9.5 \times 10^{12}$ square cm. and with an energy of 60 Kev. The P-lightly doped drain implantation 19 is done with boron fluoride at a dose of $2.5 \times 10^{13}$ square cm. and an energy of 67 Kev. The result of these process steps is shown in FIG. 2 and after all lithographic masks have been removed.

Figure 3:
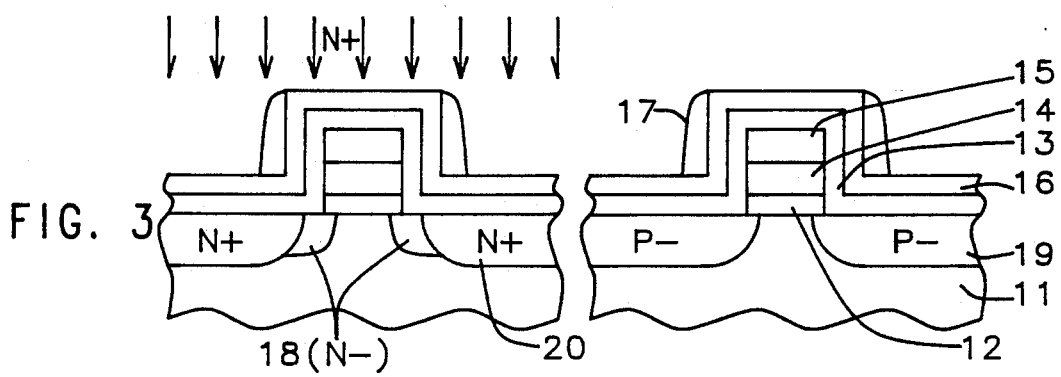
Figure 4:
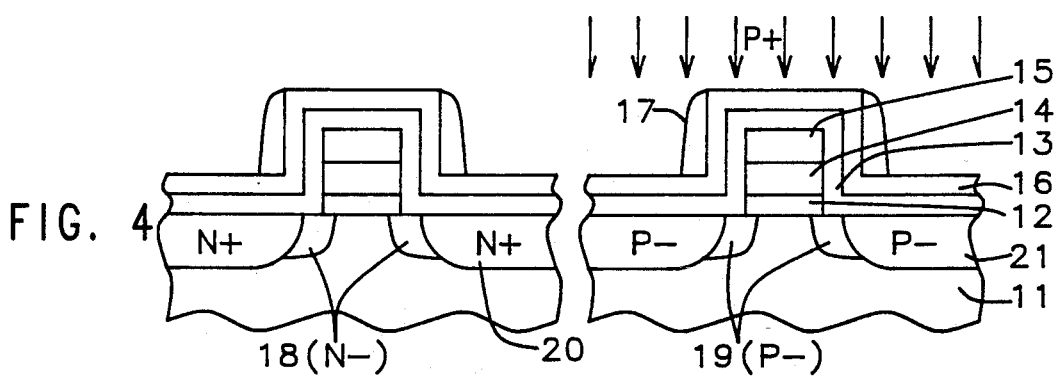

The dielectric spacer 17 is now to be formed followed by the completion of the lightly doped drain source/drain structures and may be better understood with reference to FIGS. 3 and 4. A low temperature silicon dioxide deposition is preferred such as through the chemical vapor deposition of tetraethoxysilane (TEOS) at a temperature in the range of between about 650° to 750° C. The thickness is between about 1500 to 4000 Angstroms and preferably 2500 Angstroms. An anisotropic etching of this layer produces the dielectric spacer layer 17 on the sidewalls of the polycide structures. The preferred anisotropic etching uses oxygen and $CHF_3$ as the etching gases. The silicon nitride layer 16 remains after the reactive ion etching of the spacer 17. A higher selectivity of at least 10 to 1 is necessary for this result.

The N+ source/drain implantation and drivein uses Arsenic As75 with a dose of $6 \times 10^{15}$ square cm. and energy of 80 Kev. and a drivein of 875° C. in nitrogen for 30 minutes. The P channel regions are of course protected from this ion implantation by a lithographic mask. The result of these method steps is shown in FIG. 3 wherein the N+ source/drain region is 20. The P+ source/drain implantation uses boron difluoride with a dose of $4 \times 10^{15}$ square cm. and energy of 67 Kev. The N channel regions are of course protected from this ion implantation by a lithographic mask which is removed after the drivein step. The result of these method steps is shown in FIG. 4 wherein the P+ source/drain regions are 21.

Now the passivation layer 22 is formed. The preferred material is a borophosphosilicate glass (BPSG) which is deposited preferably by LPCVD TEOS doped with 4% boron and 4% phosphorous. The layer 22 is densified and flowed to smooth the upper surface of the structure at a temperature of about 875° C. for minutes. The flow ambient can be pure nitrogen, dry oxygen or wet oxygen. The greatly preferred ambient is wet (steam) oxygen because the flow of the glass layer 22 is much easier. The great problem would be the penetration of oxygen atoms to the silicon substrate 11 and the polycide structure 14, 15 to cause unwanted oxidation thereof. However, with the proper thickness of the silicon nitride layer of between about 80 and 300 Angstroms this oxidation does not occur.

The appropriate connections now have to be made to electrically connect the various gate electrodes and source/drain elements to form the integrated circuit device. The contract to the source/drain elements requires a contact etching step that forms openings to the source/drain elements. The preferred etching is a combination of wet and dry etching using a conventional lithographic mask through the BPSG, silicon nitride and silicon dioxide layers. This includes the following conditions: a 10:1 BOE solution is used to perform the wet etching, then an etching gas composed of oxygen, argon, and $CHF_3$ is used to perform the aniotropic dry etching.

Figure 5:
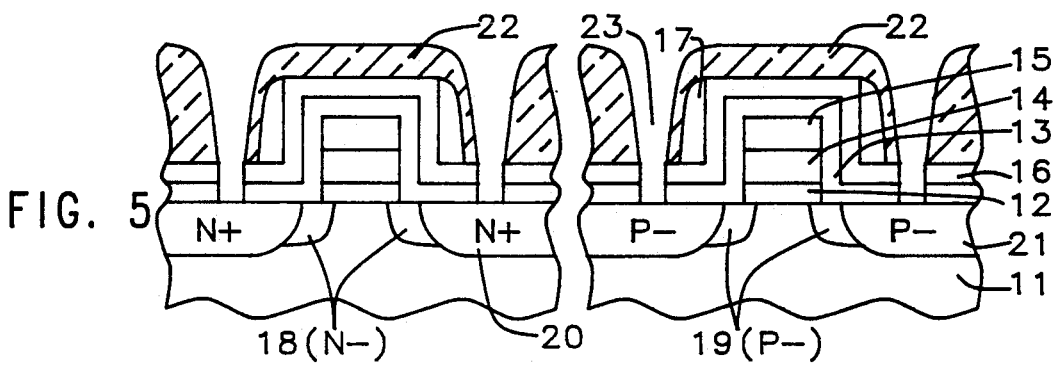
Figure 6:
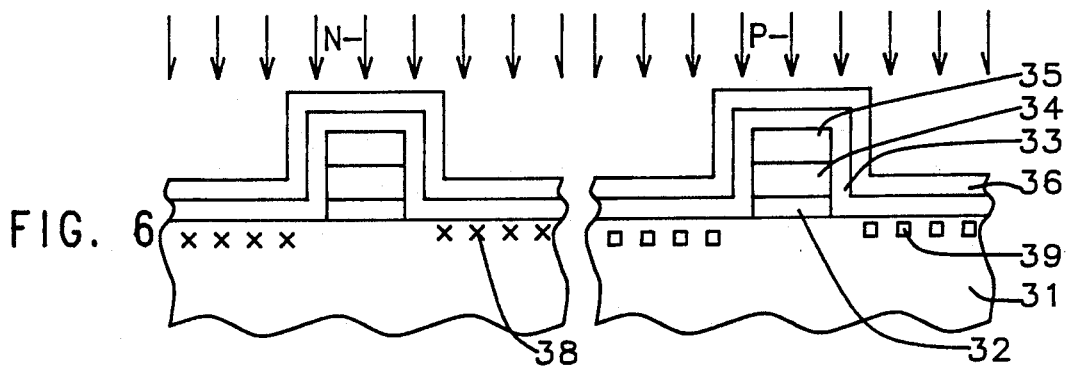
FIG. 6 through FIG. 9 schematically illustrates a second embodiment method for fabricating an lightly doped drain MOSFET integrated circuit device of the present invention.

The contact anneal is in nitrogen for 15 minutes at 875° C. The result of this process is shown in FIG. 5. Openings which are not shown are needed to make electrical contacts and are made using convention lithography and etching techniques. Appropriate metallurgy is now deposited and patterned to electrically connect the gates and source/drain elements to form the integrated circuit device. This metallurgy is conventional and may be formed of polysilicon, aluminium, aluminium with dopants of copper and/or silicon, polycide and the like.

The second embodiment may be understood with reference to FIGS. 6 through 9. A processing problem with the first embodiment of FIGS. 2 through 5 can occur should the etching selectively of silicon dioxide to silicon nitride be not adequate when the spacer 17 is formed. The present embodiment removes the silicon nitride layer with the silicon dioxide (TEOS) that is not otherwise protected by the spacer during the reactive ion etching step. All the advantages of the first embodiment holds, but this second embodiment allows the scanning electron microscope (SEM) to easily detect the spacer length parameter.

The process described with the first embodiment is followed to produce on the silicon substrate 31 the gate silicon dioxide layer 32; polycide structure 34, 35; the pad silicon oxide layer 33; the silicon nitride layer 36; N− region 38; and P− region 39 which results in FIG. 6. The TEOS silicon dioxide layer is formed as described as in the first embodiment. However, the reactive ion etching to form the dielectric spacer 37 removes the silicon nitride layer 36 except where it is under the spacer 37. This etching is done by having the selectivity of the silicon nitride to silicon dioxide to be similar in the etching ambient or by providing a second etching step to remove the silicon nitride layer after the spacer formation. The underlying silicon dioxide layers can also be removed at this same time as a process control matter.

A rapid thermal anneal is now performed to anneal damage and then a new pad silicon dioxide layer is formed having a thickness of between about 50 to 100 Angstroms and preferably about 50 Angstroms by the same rapid thermal oxidation process that the first pad oxide layer was formed.

A second thin silicon nitride layer 44 is now deposited thereover the whole device. The deposition is done in the same manner as described with regard to the thin silicon nitride layer 36 and with the same thickness, i.e. 80 to 300 Angstroms.

Figure 7:
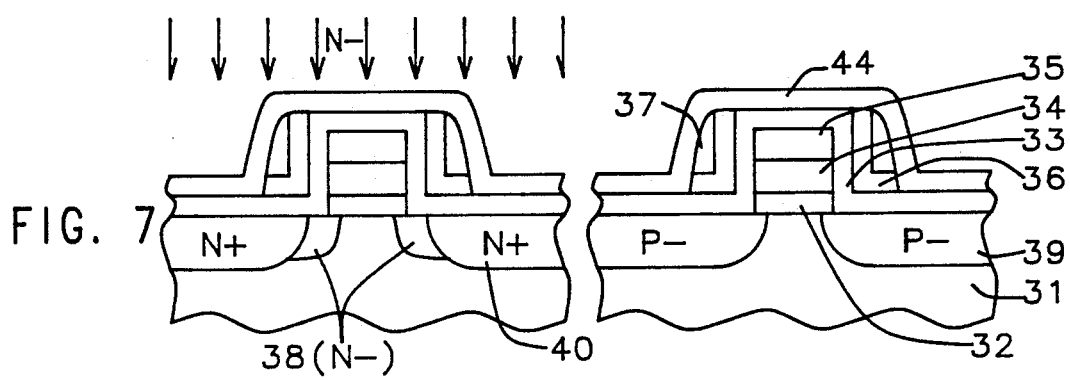
Figure 8:
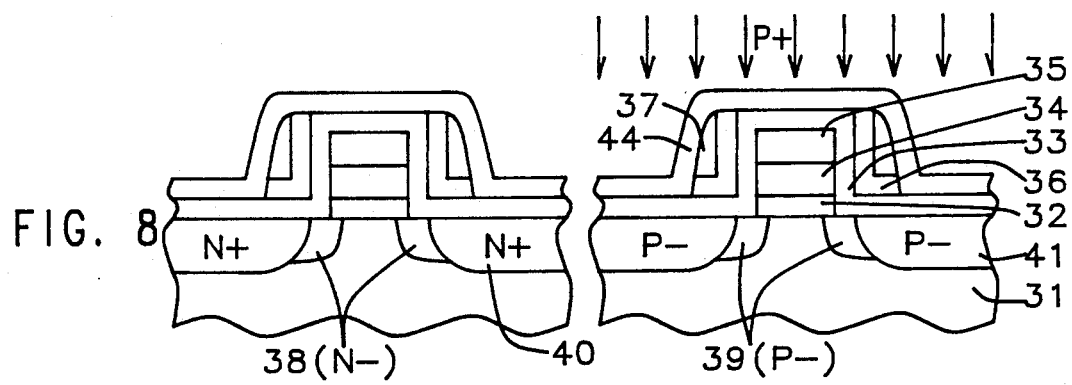

FIG. 7 shows the result of the N+ ion implantation which produces the N channel device's source/drain regions 40. FIG. 8 shows the result of the P+ ion implantation which produces the P channel device's source/drain regions 41. These are produced exactly as described in the first embodiment description above.

Figure 9:
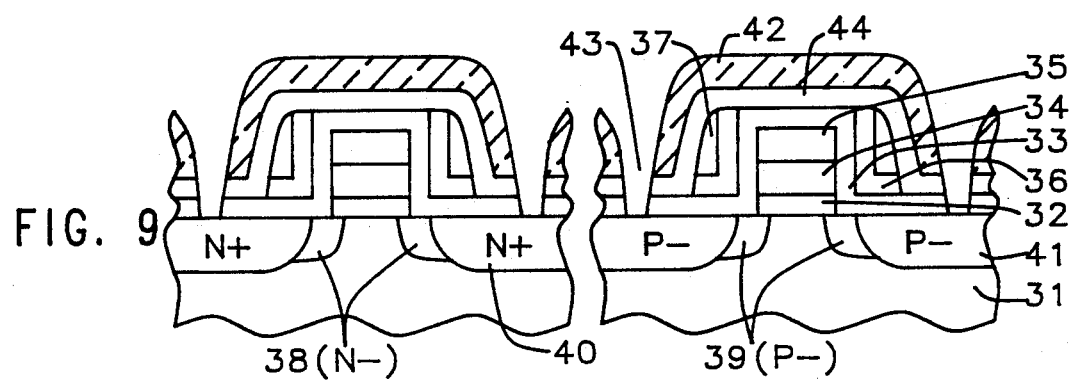

The passivation layer 42 and contact openings 43 therein are formed and processed in the same manner as described in regard to the first embodiment which results in the FIG. 9. The electrical connections, metallurgy, etc. necessary to form the integrated circuit device is also done in a similar fashion to that of the first embodiment.

The following example is given in an effort to verify the effects of the thin silicon nitride on the P+ junction depth X, surface concentration C and the growth of oxide on silicon substrate.

EXAMPLE

A P− type (100) with 15 to 25 ohm substrate was used. A N well having a depth of 2.5 micrometers and a surface concentration of $2 \times 10^{16}$ per cubic cm. was formed in the substrate. The N well silicon dioxide was removed. A pad silicon dioxide of 150 Angstrom was grown. P+ source/drain implantation was done using boron difluoride with a dose of $4 \times 10^{15}$ square cm. and energy of 60 Kev. A low pressure chemical vapor deposited silicon nitride of 150 Angstroms in thickness on wafers numbers 1 through 4 and no silicon nitride layer was deposited on wafer 5 through 8 (control). A low temperature chemical vapor deposition (TEOS) of a silicon dioxide (passivation layer) of a thickness of 7500 Angstroms is formed on all wafers. The passivation thickness was measured. The passivation layer was flowed at 950° C. in wet oxygen for 60 minutes and in nitrogen for 30 minutes. The passivation layer thickness was again measured. Sheet resistance measurement by four point probe method with the oxide and nitride removed was made. Spreading resistance profile analysis (SRP), and secondary ion mass spectroscopy (SIMS) analysis were made.

The experimental results were that the junction depth of all source/drain junctions were 0.6 micrometers. The wafers with the silicon nitride layer had no thermal oxidation of the substrate while the wafers without the layer had 880 Angstroms of thermal oxide. The resistance in ohm per square with the silicon nitride layer was 47 and was 182 without the nitride layer. The surface concentration was $1 \times 10^{20}$ per cubic cm. for wafers with the nitride layer and $1 \times 10^{19}$ per cubic cm. without the nitride layer (SIMS & SRP).

Figure 10:
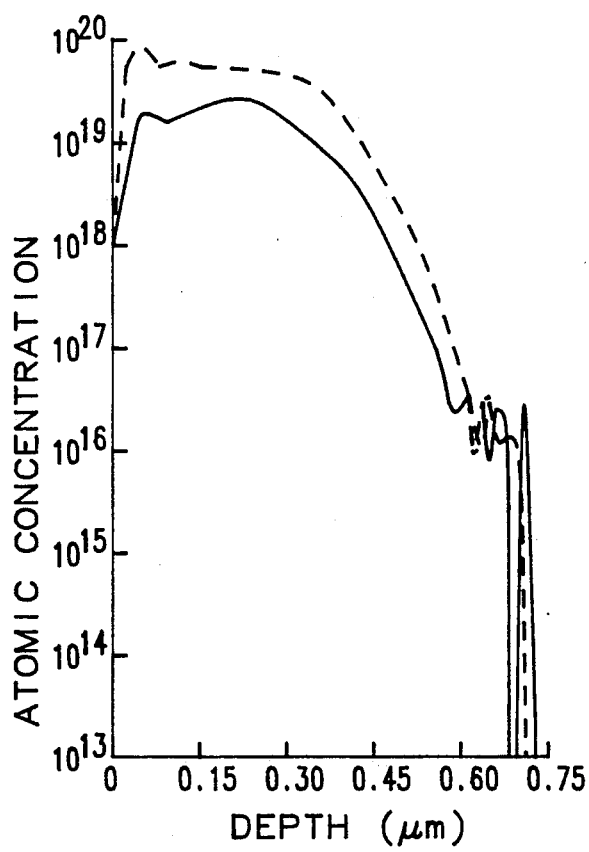
FIG. 10 and FIG. 11 are graphical representations which illustrate the advantages of the silicon nitride layer as used in the present invention.
Figure 11:
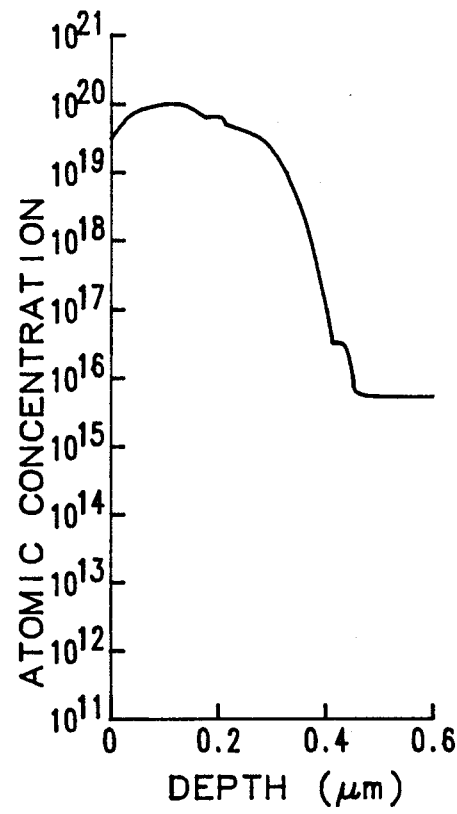

The experimental results listed in the above paragraph show that the dense structure of the silicon nitride layer prevents the oxygen atoms from penetrating the nitride layer to form an silicon dioxide layer with the silicon substrate. As a result, there is no silicon oxide grown during the flow of the passivation layer for the wafers capped with the thin nitride layer, while the wafers without the nitride capped layer had silicon oxide growth that averaged 880 Angstroms. Since boron atoms cannot penetrate the nitride layer either, almost all of the boron atoms will be kept in the silicon substrate. Only a few of these atoms have diffused into the 50 Angstrom pad oxide. This results in a very high surface concentration and low sheet resistance for the samples capped with nitride. As for the samples without nitride capped, the boron atoms can diffuse to the passivation region and this causes a great loss of boron atoms from the silicon region. The result of this is low surface concentration and high sheet resistance are found. This is evident from the results of the SIMS analysis and as shown in FIG. 10 where curve 50 shows the concentrations depth for the silicon nitride capped samples and curve 52 shows the results for the uncapped samples. The SRP analysis is shown in FIG. 11 for the nitride capped case with curve 54. The junction depth for both cases are about the same as can be seen from FIG. 10. These experiments prove the many advantages claimed for the use of the silicon nitride layer in the presently described method for making lightly doped drain MOS FET integrated circuit devices.

While the invention has been particularly shown and described with reference to the preferred embodiments thereon it will be understood by those skilled in the art that various changes in form and details may be make without departing from the spirit and scope of the invention. For example, while the detailed examples of the integrated circuit devices used CMOS FET integrated circuit devices, it is obvious that bipolar devices could be added to make BICMOS structures.

What is claimed is:

1. A lightly doped drain MOS FET integrated circuit device comprising:
   a pattern of gate electrode structures upon a semiconductor substrate which structures each have vertical sidewalls and includes a gate oxide, a polysilicon layer and a refractory metal silicide;
   a first thin silicon nitride layer with a thickness in the range of 80 to 300 Angstroms over said each of said gate electrode structures, including said vertical sidewalls, and over the surface of said substrate; a pattern of lightly doped regions in said substrate adjacent to said structures;
   a dielectric spacer structure upon the sidewalls of each of said structures and over the adjacent portions of said substrate;
   a pattern of heavily doped regions in said substrate adjacent to said dielectric spacer structure on the vertical sidewalls of said gate electrode structures, which form lightly doped drain source/drain structures of an MOS FET device;
   a passivation layer over the said structures and appropriate electrical connecting structures thereover to electrically connect the said structure gate electrode structures and source/drain elements to form said integrated circuit device; and
   wherein a second thin silicon nitride layer is formed over said spacer structures and over said substrate, and said passivation layer is formed over said second thin silicon nitride layer.

2. The integrated circuit device of claim 1 wherein said passivation layer is a heat smoothed borosilicate glass layer having a thickness of between about 5000 to 10000 Angstroms.

3. The integrated circuit device of claim 1 wherein said first thin silicon nitride layer remains a part of the resulting device under the said dielectric spacer structures and said second thin silicon nitride layer remains a part of the resulting integrated circuit device.

4. The integrated circuit device of claim 1 wherein a thin silicon dioxide layer less than about 100 Angstroms in thickness is located under the said first thin silicon nitride layer and the thickness of said second thin silicon nitride layer is less than about 300 Angstroms.

5. The integrated circuit device of claim 1 wherein the said refractory metal silicide is tungsten silicide, the thickness of said tungsten silicide layer is between about 1000 and 3000 Angstroms and the thickness of the said polysilicon layer is between about 1000 and 3000 Angstroms.

* * * * *